United States Patent
Yamaguchi et al.

(10) Patent No.: US 11,114,319 B2
(45) Date of Patent: Sep. 7, 2021

(54) HEAT TREATMENT APPARATUS AND HEAT TREATMENT METHOD

(71) Applicant: Tokyo Electron Limited, Tokyo (JP)

(72) Inventors: Tatsuya Yamaguchi, Iwate (JP); Yasuaki Kikuchi, Iwate (JP); Koji Yoshii, Iwate (JP); Wataru Nakajima, Iwate (JP); Norio Baba, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 111 days.

(21) Appl. No.: 16/690,712

(22) Filed: Nov. 21, 2019

(65) Prior Publication Data

US 2020/0168486 A1    May 28, 2020

(30) Foreign Application Priority Data

Nov. 27, 2018 (JP) .............................. JP2018-221614

(51) Int. Cl.
| | |
|---|---|
| *H01L 21/67* | (2006.01) |
| *H01L 21/263* | (2006.01) |
| *H01L 21/66* | (2006.01) |

(52) U.S. Cl.
CPC .... *H01L 21/67109* (2013.01); *H01L 21/2636* (2013.01); *H01L 22/30* (2013.01)

(58) Field of Classification Search
CPC ......... H01L 21/67098; H01L 21/67103; H01L 21/67109; H01L 21/67115
See application file for complete search history.

(56) References Cited

U.S. PATENT DOCUMENTS

| | | | | |
|---|---|---|---|---|
| 2004/0261374 A1* | 12/2004 | Bailey | .................. | F01N 3/0842 55/302 |
| 2011/0223552 A1* | 9/2011 | Kobayashi | ........ | H01L 21/67109 432/4 |
| 2014/0073146 A1* | 3/2014 | Okada | ............... | C23C 16/45542 438/798 |
| 2014/0256160 A1* | 9/2014 | Wada | .................. | H01L 21/0262 438/786 |
| 2015/0093909 A1* | 4/2015 | Murata | .................. | C23C 16/46 438/758 |

FOREIGN PATENT DOCUMENTS

| | | |
|---|---|---|
| JP | H07-263369 A | 10/1995 |
| JP | 2002-075890 A | 3/2002 |

* cited by examiner

*Primary Examiner* — Jae Lee
(74) *Attorney, Agent, or Firm* — Abelman, Frayne & Schwab

(57) ABSTRACT

A heat treatment apparatus includes a heating unit provided around a processing container accommodating a substrate; a plurality of blowing units configured to blow a cooling medium into a space between the processing container and the heating unit; and a shutter configured to simultaneously opens/closes at least two of the plurality of blowing units and including a slit formed corresponding to each of the blowing units.

16 Claims, 12 Drawing Sheets

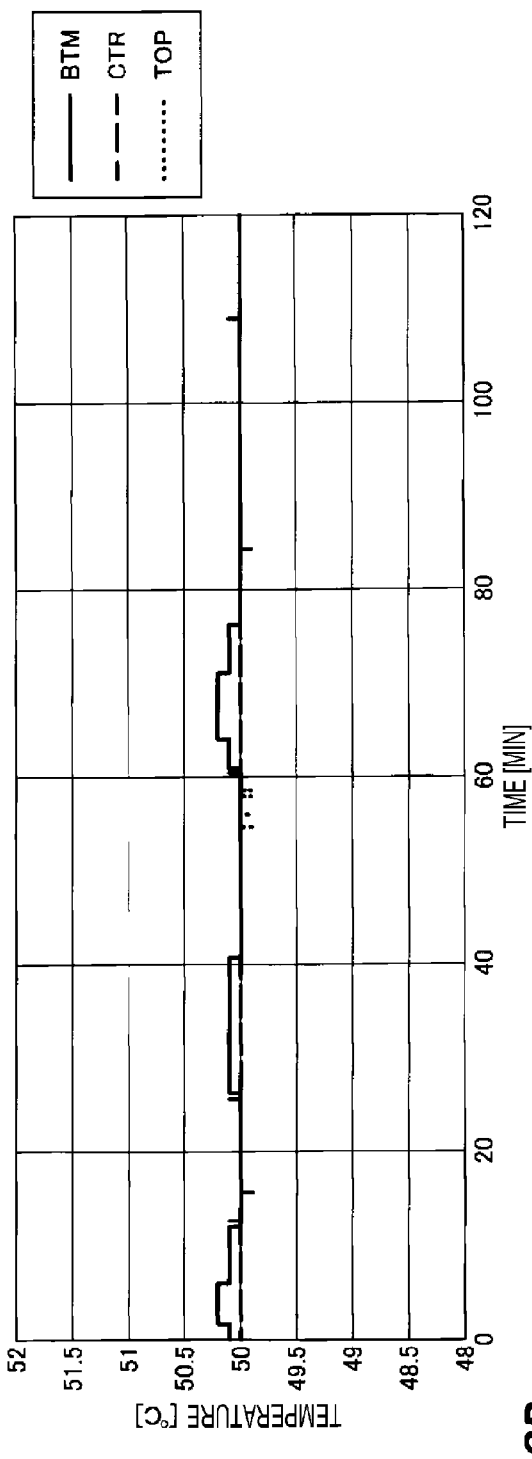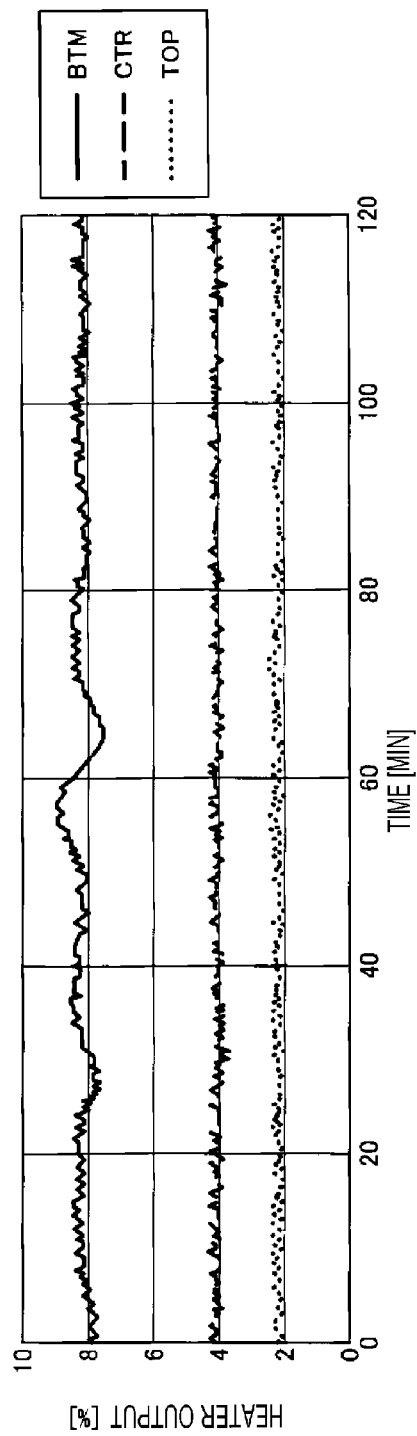
FIG. 8A
FIG. 8B

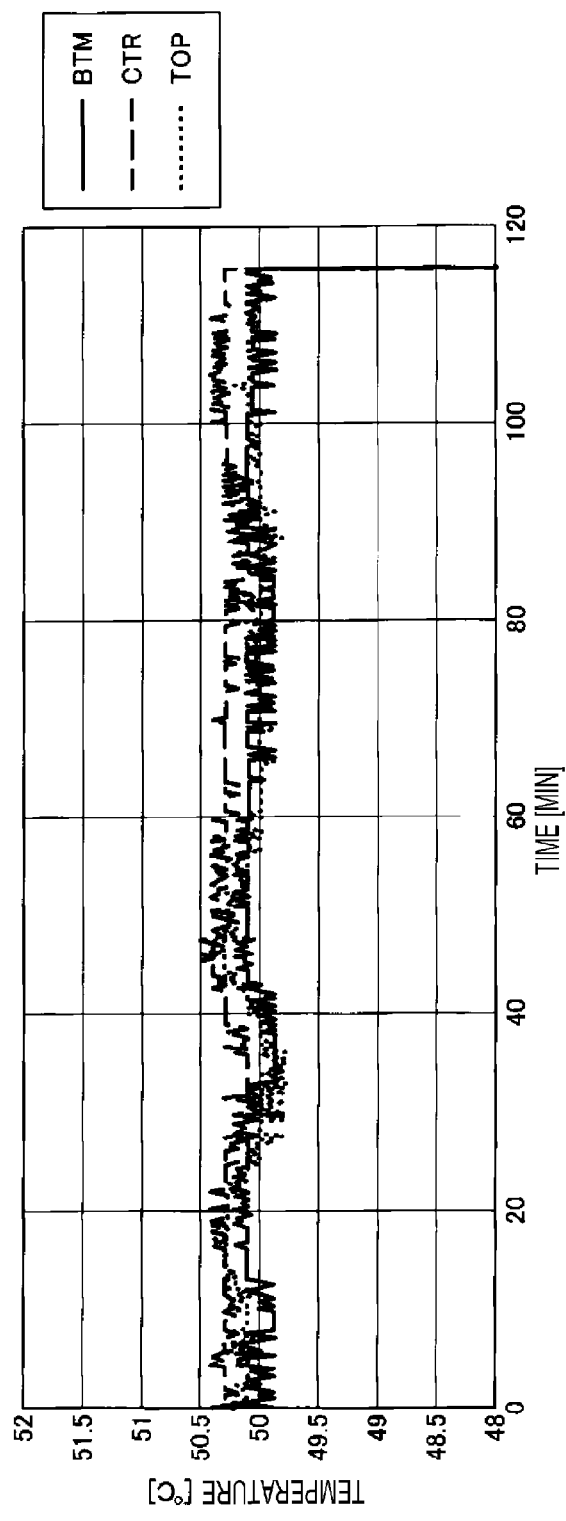
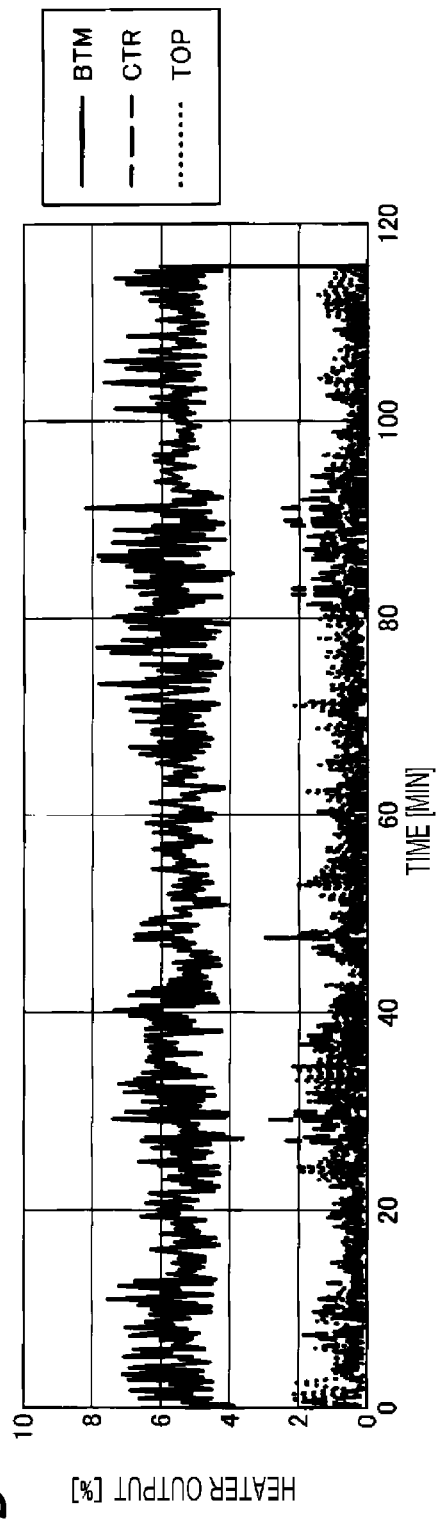
FIG. 9A
FIG. 9B

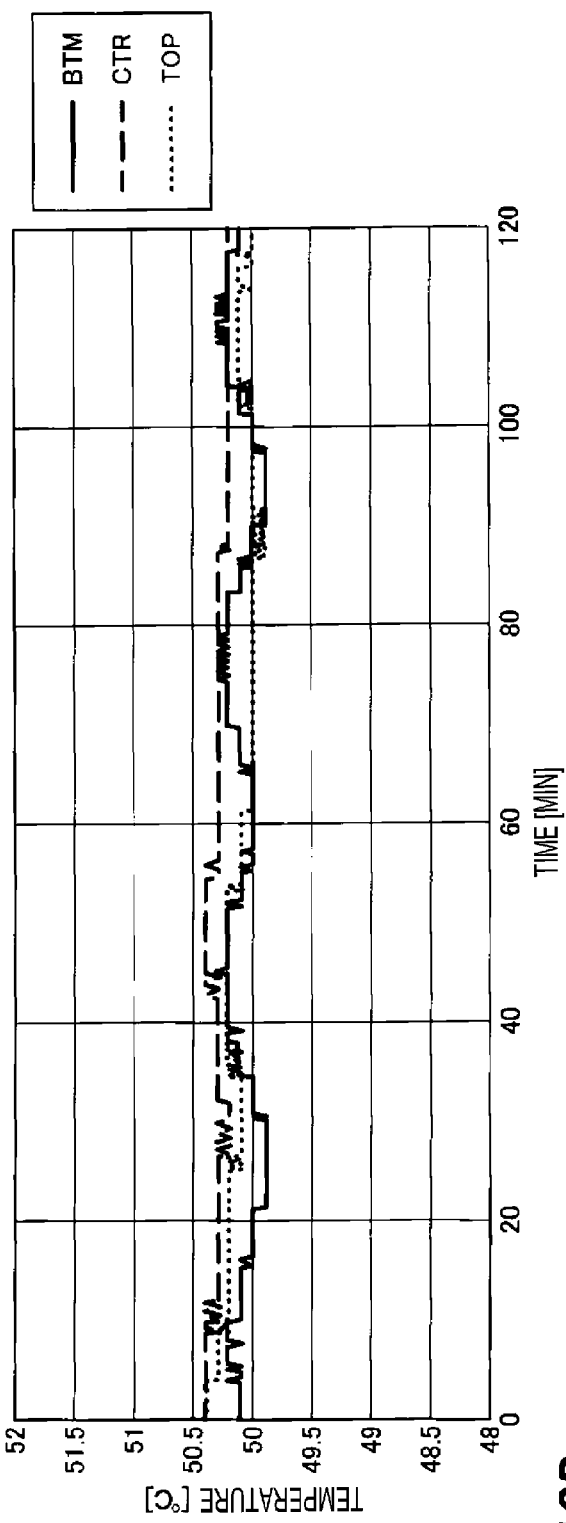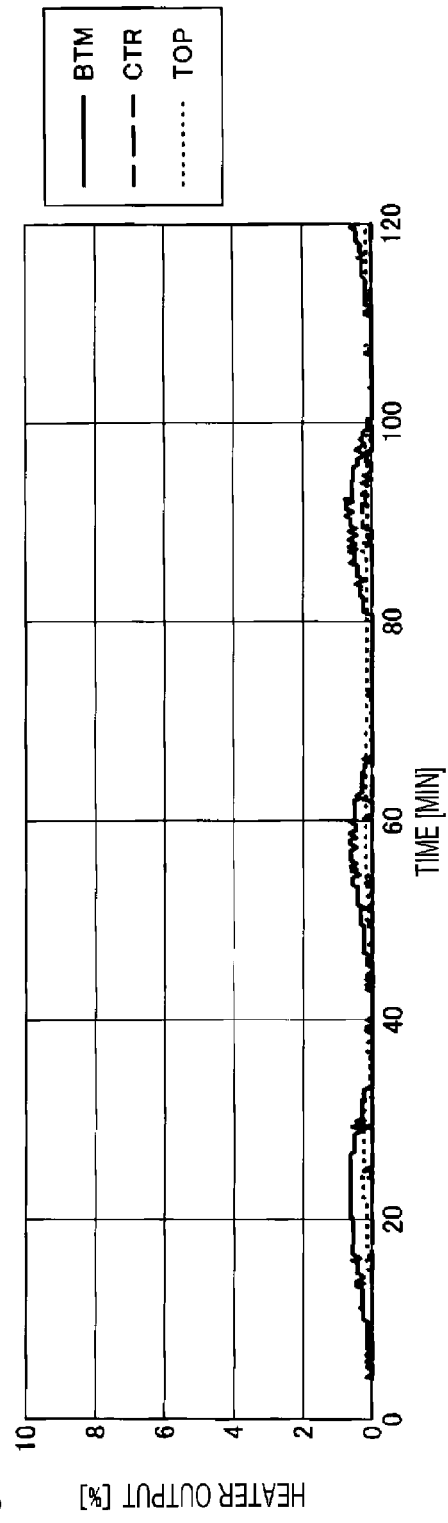

HEAT TREATMENT APPARATUS AND HEAT TREATMENT METHOD

CROSS-REFERENCE TO RELATED APPLICATIONS

This application is based on and claims priority from Japanese Patent Application No. 2018-221614 filed on Nov. 27, 2018 with the Japan Patent Office, the disclosure of which is incorporated herein in its entirety by reference.

TECHNICAL FIELD

The present disclosure relates to a heat treatment apparatus and a heat treatment method.

BACKGROUND

In a vertical-type heat treatment apparatus that collectively performs heat treatment on a plurality of substrates, a configuration including a heating unit provided around a processing container, and a cooling unit blowing a cooling gas between the processing container and a heater has been known (see, e.g., Japanese Patent Laid-Open Publication Nos. 2002-075890 and 07-263369).

SUMMARY

A heat treatment apparatus according to one aspect of the present disclosure includes a heating unit provided around a processing container accommodating a substrate; a plurality of blowing units configured to blow a cooling medium into a space between the processing container and the heating unit; and a shutter configured to simultaneously open/close at least two of the plurality of blowing units and including a slit formed corresponding to each of the blowing units.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 8A and 8B are views illustrating a temperature characteristic and a heater output characteristic of Test Example 1.

FIGS. 9A and 9B are views illustrating a temperature characteristic and a heater output characteristic of Test Example 2.

FIGS. 10A and 10B are views illustrating a temperature characteristic and a heater output characteristic of Test Example 3.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

[Heat Treatment Apparatus]

Figure 1:
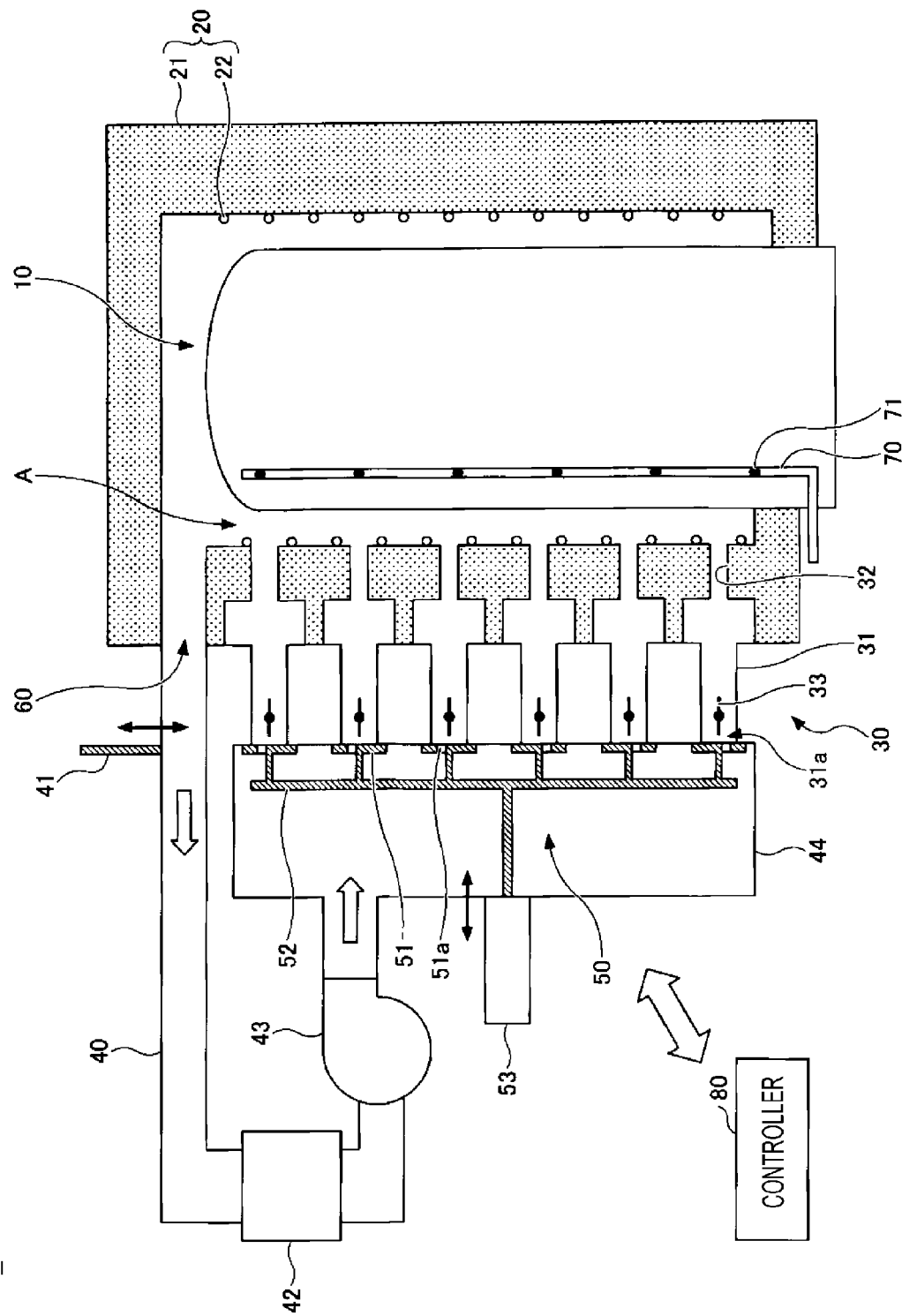
FIG. 1 is a schematic view (1) illustrating an exemplary configuration of a heat treatment apparatus.
Figure 2:
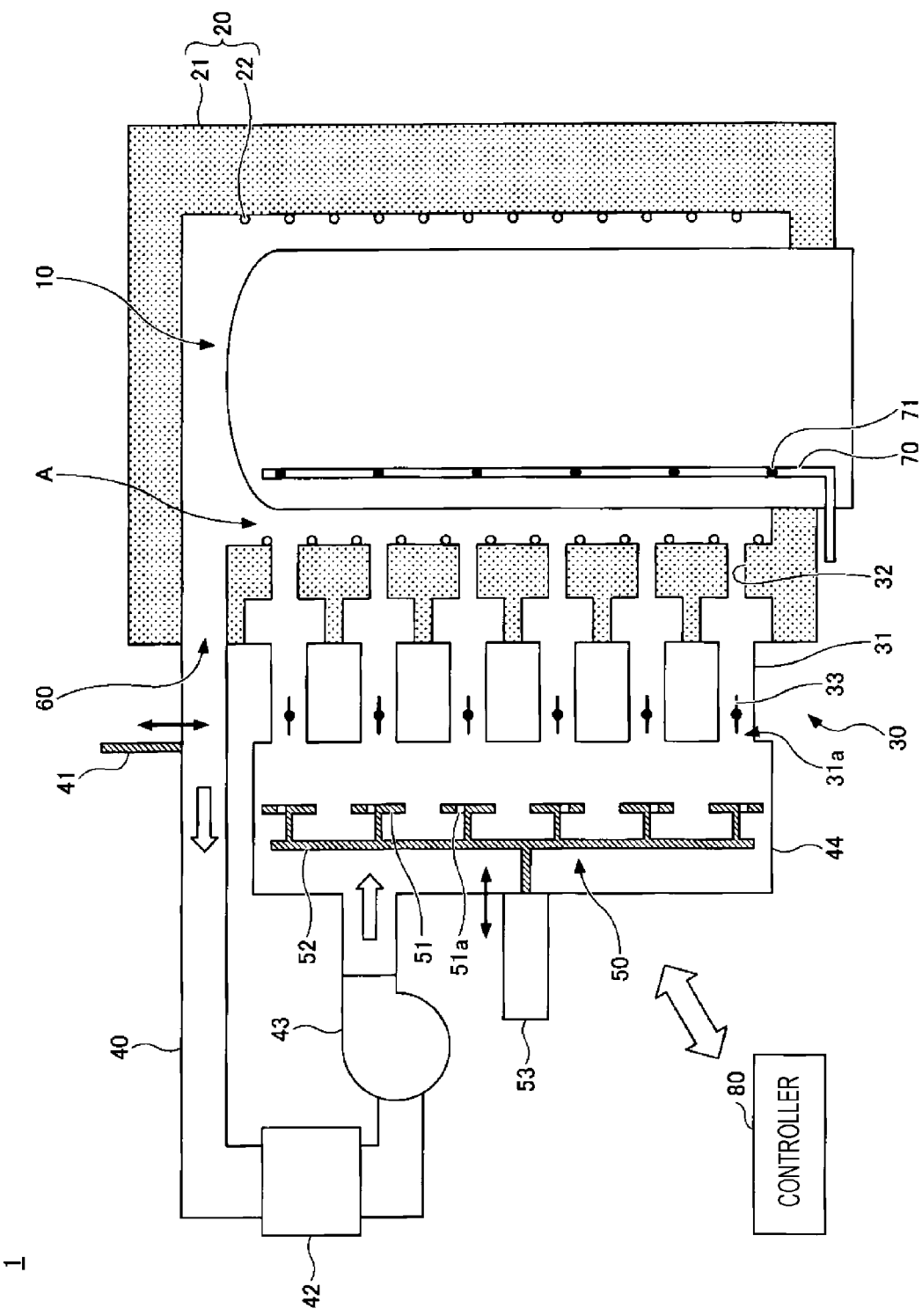
FIG. 2 is a schematic view (2) illustrating an exemplary configuration of a heat treatment apparatus.

An exemplary configuration of a heat processing apparatus will be described. FIGS. 1 and 2 are schematic views illustrating an exemplary configuration of a heat treatment apparatus.

As illustrated in FIG. 1, the heat processing apparatus 1 includes a processing container 10, a heating unit 20, a blowing unit 30, a medium flowing path 40, a shutter mechanism 50, a heat exhaust unit 60, a temperature detector 70, and a controller 80.

The processing container 10 is long in a vertical direction, and accommodates a semiconductor wafer (hereinafter, referred to as a "wafer") which is a substrate. The wafer is accommodated in the processing container 10, for example, in a state of being held in a wafer boat while having a predetermined interval in a height direction. The processing container 10 has a double tube structure in which, for example, a cylindrical inner tube having a ceiling with a lower end opened and a cylindrical outer tube having a ceiling which is opened at its lower end to cover the outer side of the inner tube are disposed coaxially. Meanwhile, the processing container 10 may be a single tube structure. The processing container 10 is made of a heat-resistant material such as quartz. The inside of the processing container 10 is depressurized to a predetermined pressure by an exhaust unit including, for example, a pressure regulating valve and a vacuum pump. Further, a processing gas such as a film forming gas and an etching gas, or a purge gas such as an inert gas are introduced into the processing container 10 by a gas supply including, for example, a gas introduction pipe, an opening/closing valve, a flow rate controller, or the like.

The heating unit 20 is provided around the processing container 10, and heats the wafer in the processing container 10. The heating unit 20 includes a heat insulator 21 and a heating element 22.

The heat insulator 21 has a cylindrical shape, and is mainly made of silica and alumina. The shape and the material of the heat insulator 21 are not limited thereto.

The heating element 22 has a linear shape, and is provided in a spiral shape or a meandering shape on an inner wall of the heat insulator 21. The heating element 22 may be provided by being divided into a plurality of zones in the height direction of the processing container 10. Therefore, it is possible to control the temperature for each of the plurality of zones. Further, in order to maintain the shape of the heat insulator 21 and to reinforce the heat insulator 21, the outer periphery of the heat insulator 21 may be covered with a metal outer cover such as stainless steel. Further, in order to suppress the heat influence on the exterior of the heating unit 20, the outer periphery of the outer cover may be covered with a water-cooling jacket.

The blowing unit 30 blows a cooling medium (e.g., air) into a space A between the processing container 10 and the heating unit 20. A plurality (six in the illustrated example) of blowing units 30 are provided along the longitudinal direction of the processing container 10. The number of the blowing units 30 is not limited. However, when the heating element 22 is divided into a plurality of zones, the blowing unit 30 may be formed corresponding to the plurality of zones. For example, when the heating element 22 is divided into six zones, six branches 31 may be provided corresponding to the number of the zones of the heating element 22. The blowing unit 30 includes a branch 31, a blowing hole 32, and a butterfly valve 33.

Figure 3:
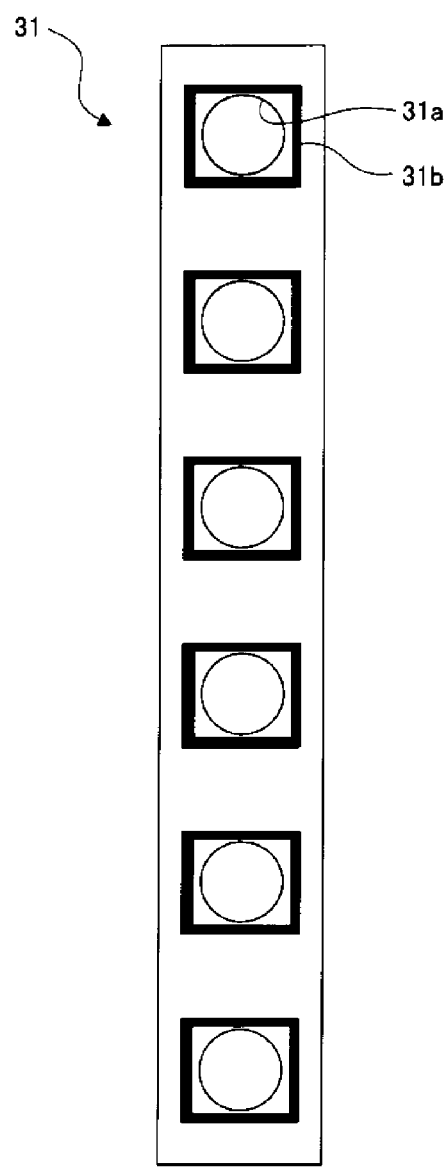
FIG. 3 is a view for explaining an inlet of a branch of the heat treatment apparatus of FIG. 1.

The branch 31 is a duct communicating with a medium flowing path 40 described later. As illustrated in FIG. 3, a seal member 31b made of, for example, rubber is provided around an inlet 31a of the branch 31. FIG. 3 is a view for explaining the inlet 31a of the branch 31 of the heat treatment apparatus 1 of FIG. 1, when the branch 31 is viewed from a side on which the shutter mechanism 50 is provided.

The blowing hole 32 penetrates the heat insulator 21 of the heating unit 20, and includes one end communicating with the branch 31, and the other end communicating with the space A. The blowing hole 32 blows a cooling medium toward the processing container 10 in a substantially horizontal direction. One blowing hole 32 is formed for one branch 31. Two or more blowing holes 32 may be formed for one branch 31.

The butterfly valve 33 is provided in each of the plurality of branches 31. The butterfly valve 33 controls the flow rate of the cooling medium flowing in the branch 31 by changing the angle of the valve with respect to the flow direction of the cooling medium in the branch 31. The butterfly valve 33 is, for example, a manual type having a lever or a handle for rotating the valve.

The medium flowing path 40 supplies a cooling medium to the plurality of blowing units 30. The medium flowing path 40 communicates with a heat exhaust unit 60 described later at its upstream side, and the plurality of blowing units 30 at its downstream side. The medium flowing path 40 is provided with an opening/closing valve 41, a heat exchanger 42, a blower 43, and a buffer space 44 in this order from the upstream side.

The opening/closing valve 41 opens/closes the medium flowing path 40. The heat exchanger 42 cools the cooling medium discharged by the heat exhaust unit 60. The blower 43 sends the cooling medium cooled by the heat exchanger 42 to the buffer space 44. The buffer space 44 communicates with the plurality of blowing units 30, and diverts the cooling medium sent by the blower 43 to the plurality of blowing units 30.

The shutter mechanism 50 simultaneously opens/closes the plurality of blowing units 30. The shutter mechanism 50 includes a plurality of shutters 51, a connector 52, and a driving unit 53.

Figure 4:
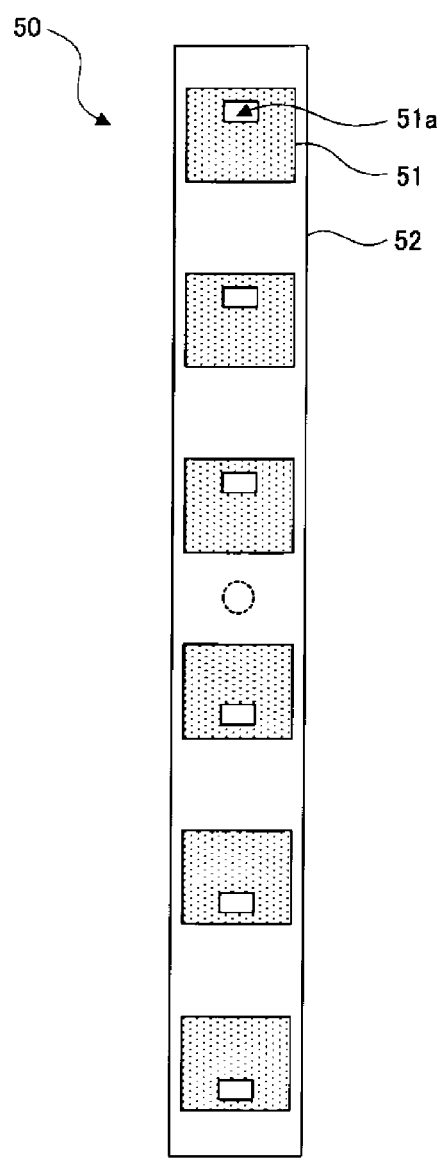
FIG. 4 is a view for explaining a shutter mechanism of the heat treatment apparatus of FIG. 1.

The shutters 51 are provided in the buffer space 44 of the medium flowing path 40. Each shutter 51 is provided corresponding to each of the plurality of branches 31. Each shutter 51 is formed of a plate-shaped member having a size that can cover the inlet 31a of the branch 31. As illustrated in FIG. 4, each shutter 51 includes a rectangular slit 51a. FIG. 4 is a view for explaining the shutter mechanism 50 of the heat treatment apparatus 1 of FIG. 1, when the shutter mechanism 50 is viewed from the blowing unit 30 side.

The connector 52 connects and supports the plurality of shutters 51.

Figure 5:
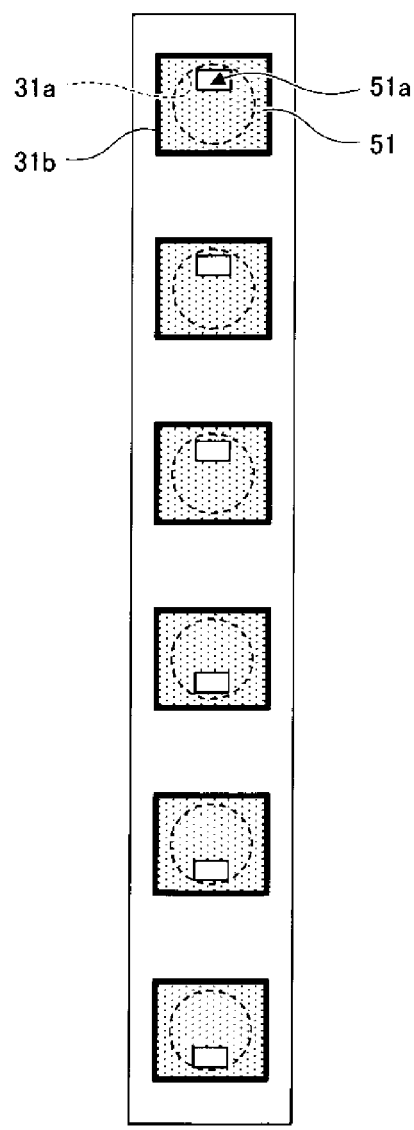
FIG. 5 is a view illustrating a state where the inlet of the branch is covered with the shutter.

The driving unit 53 is connected to the connector 52. The driving unit 53 moves the connector 52 to move the shutter 51 between a closed position covering the inlet 31a of the plurality of branch 31 (see FIG. 1) and an opened position spaced apart from the inlet 31a of the plurality of branch 31 (see FIG. 2). As illustrated in FIG. 5, in the closed position, the outer periphery of the shutter 51 is in close contact with the seal member 31b, and the slit 51a is overlapped with the inlet 31a of the branch 31. Therefore, the cooling medium flows into the branch 31 through the slit 51a. FIG. 5 is a view illustrating a state where the inlet 31a of the branch 31 is covered with the shutter 51, when the shutter 51 and the branch 31 are viewed from the driving unit 53 side. The driving unit 53 is, for example, a solenoid.

Two types of cooling medium ranges supplied to the space A may be provided by having the shutter mechanism 50 in this manner. The shutter mechanism 50 may simultaneously open/close at least two of the plurality of blowing units 30, and is not limited to the type which is capable of opening/closing simultaneously all of the six blowing units 30 as illustrated in FIG. 1. For example, the shutter mechanism 50 may include a first shutter mechanism capable of opening/closing simultaneously the upper three blowing units 30 and a second shutter mechanism capable of opening/closing simultaneously the lower three blowing units 30, and the first shutter mechanism and the second shutter mechanism may be independently driven.

The heat exhaust unit 60 is an exhaust port which includes one end communicating with the space A above the plurality of the blowing holes 32 and the other end communicating with the medium flowing path 40. The heat exhaust unit 60 discharges the cooling medium in the space A to the outside of the heat treatment apparatus 1. The cooling medium discharged to the outside of the heat treatment apparatus 1 by the heat exhaust unit 60 is cooled by the heat exchanger 42 provided in the medium flowing path 40 and is supplied again from the blowing unit 30 to the space A. The cooling medium discharged to the outside of the heat treatment apparatus 1 may be discharged without being reused.

The temperature detector 70 detects a temperature in the processing container 10. The temperature detector 70 is, for example, a thermocouple, and temperature measuring units 71 of the thermocouple are provided corresponding to the plurality of zones, respectively. The temperature detector 70 may be a type which detects the temperature in the space A.

A controller 80 controls an operation of each component of the heat treatment apparatus 1. For example, the controller 80 switches between a small flow rate mode and a large flow rate mode, in response to a processing performed in the heat treatment apparatus 1. The small flow rate mode is a mode for controlling the heating unit 20 based on the temperature detected by the temperature detector 70, in a state where the shutter 51 is moved to the closed position by operating the driving unit 53. In the small flow rate mode, since the shutter 51 covers the inlet 31a of the branch 31, a small flow rate of the cooling medium passing through the slit 51a of the shutter 51 flows into the branch 31. As a result, a small flow rate of the cooling medium is supplied to the space A. The large flow rate mode is a mode for controlling the heating unit 20 based on the temperature detected by the temperature detector 70, in a state where the shutter 51 is moved to the opened position by operating the driving unit 53. In the large flow rate mode, since the shutter 51 is spaced apart from the inlet 31a of the branch 31, a large flow rate of the cooling medium flows into the branch 31. As a result, a large flow rate of the cooling medium is supplied to the space A.

Figure 6:
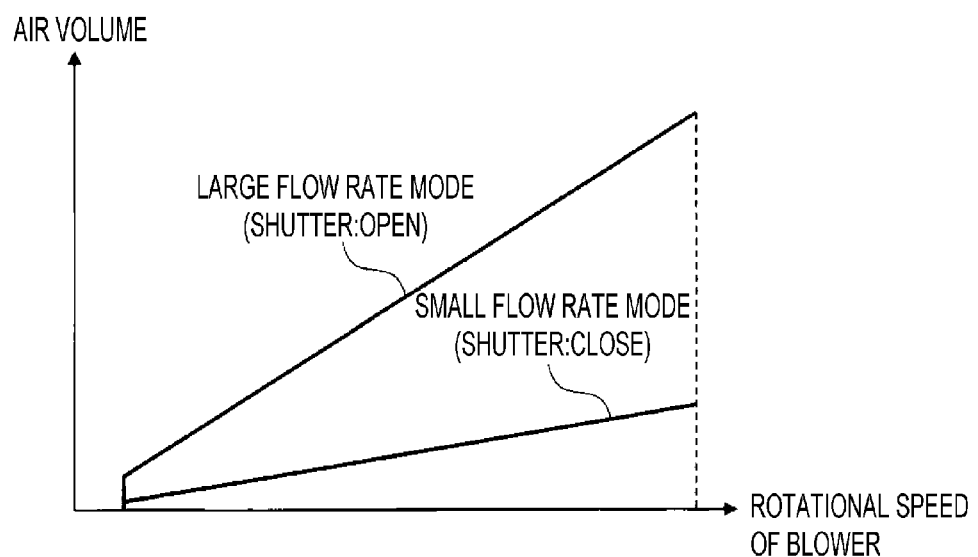
FIG. 6 is a view illustrating a relationship between a rotational speed of a blower and air volume.

Further, for example, as illustrated in FIG. 6, the controller 80 controls the rotational speed of the blower 43 in each of the small flow rate mode and the large flow rate mode. For example, when it is desired to suppress overshoot, the controller 80 controls the rotational speed of the blower 43 in a state of being switched to the small flow rate mode. Further, for example, when it is desired to cool at high speed or to perform high-precision control at a low temperature, the controller 80 controls the rotational speed of the blower 43 in a state of being switched to the large flow rate mode. FIG. 6 is a view illustrating a relationship between the rotational speed of the blower and the air volume, and the rotational speed of the blower is illustrated on the horizontal axis, and the air volume is illustrated on the vertical axis.

The controller 80 may be, for example, a computer. A computer program that performs an operation of each component of the heat treatment apparatus 1 is stored in a storage medium. The storage medium may be, for example, a flexible disk, a compact disk, a hard disk, a flash memory, and a DVD.

[Operation of Heat Treatment Apparatus]

Figure 7:
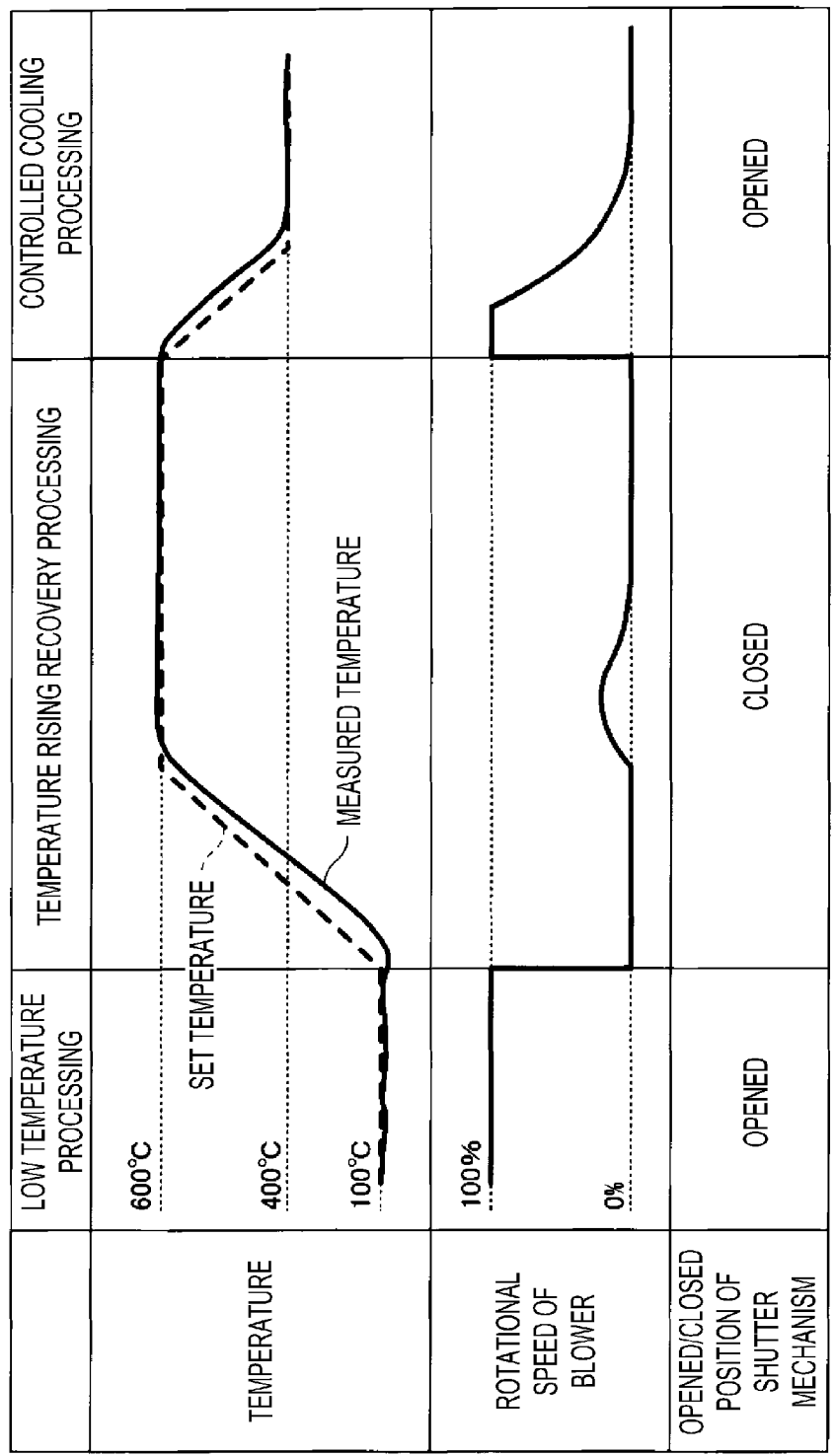
FIG. 7 is a view illustrating an exemplary operation of the heat treatment apparatus.

An exemplary operation (heat treatment method) of the heat treatment apparatus will be described. The following heat treatment method is executed by controlling the operation of each component of the heat treatment apparatus 1 by the controller 80. FIG. 7 is a view illustrating an exemplary operation of the heat treatment apparatus 1. FIG. 7 illustrates the controlled temperature, the temperature detected by the temperature detector 70, the rotational speed of the blower 43, and the position of the shutter 51 when a low temperature processing, a temperature rising recovery processing, and a controlled cooling processing are performed in this order.

In the low temperature processing, the controller 80 controls the heating unit 20 to cause the temperature detected by the temperature detector 70 to be 100° C. in a state where the rotational speed of the blower 43 is set to be 100% and the shutter mechanism 50 is moved to the opened position. Therefore, since it is possible to use the cooling by the large flow rate of the cooling medium and the heat generation by the heating unit 20, as illustrated in FIG. 7, the temperature detected by the temperature detector 70 may be controlled to be the temperature which is substantially the same as the set temperature.

In the temperature rising recovery processing, at first, the controller 80 performs ramping control on the heating unit 20 to cause the temperature detected by the temperature detector 70 to be 100° C. to 600° C. in a state where the rotational speed of the blower 43 is set to be 0% and the shutter mechanism 50 is moved to the closed position. Subsequently, after the temperature detected by the temperature detector 70 reaches 600° C., the controller 80 controls the rotational speed of the blower 43 in a range of 0% to several tens % in a state where the shutter mechanism 50 is maintained in the closed position. Therefore, after the temperature detected by the temperature detector 70 reaches the set temperature, the processing container 10 is cooled by the small flow rate of the cooling medium, so that overshoot may be suppressed.

In the controlled cooling processing, at first, the controller 80 performs ramping control on the heating unit 20 to cause the temperature detected by the temperature detector 70 to be lowered from 600° C. to 400° C. in a state where the rotational speed of the blower 43 is set to be 100% and the shutter mechanism 50 is moved to the opened position. Subsequently, after the temperature detected by the temperature detector 70 is approached to 600° C., the controller 80 reduces the rotational speed of the blower 43 from 100% to 0% in a state where the shutter mechanism 50 is maintained in the opened position.

As described above, according to the heat treatment apparatus 1, the shutter 51, provided with the slit 51a that simultaneously opens/closes at least two of the plurality of blowing units 30 which blows the cooling medium into the space A between the processing container 10 and the heating unit 20, is provided. Therefore, since the heating unit 20 is controlled while opening the shutter 51 and supplying the large flow rate of the cooling medium to the processing container 10, it is possible to control the temperature in the processing container 10 by the cooling by the large flow rate of the cooling medium and the heating by the heating unit 20. As a result, the temperature controllability at the low temperature (e.g., 30° C. to 100° C.) is improved. Further, since the heating unit 20 is controlled while closing the shutter 51 and supplying the small flow rate of the cooling medium to the processing container 10, it is possible to control the temperature in the processing container 10 by the cooling by the small flow rate of the cooling medium and the heating by the heating unit 20. As a result, the temperature controllability at the high temperature (e.g., 600° C. to 1,000° C.) is improved. That is, the temperature controllability from the low temperature to the high temperature is improved.

[Evaluation Result]

Test Examples 1 to 3

In Test Examples 1 to 3, the temperature controllability at a low temperature is evaluated by measuring the time change of the temperature detected by the temperature detector 70 and the time change of the heater output, when the controlled temperature is set to a low temperature (50° C.).

In Test Example 1, in the heat treatment apparatus 1 described above, the time change of the temperature and the heater output is evaluated when the heating unit 20 is controlled based on the temperature detected by the temperature detector 70 in a state where the rotational speed of the blower 43 is set to be 100% and the shutter 51 is moved to the opened position.

In Test Example 2, in the heat treatment apparatus 1 described above, the time change of the temperature and the heater output is evaluated when the heating unit 20 is controlled based on the temperature detected by the temperature detector 70 in a state where the rotational speed of the blower 43 is set to be 100% and the shutter 51 is moved to the closed position.

In Test Example 3, in the heat treatment apparatus 1 described above, the time change of the temperature and the heater output is evaluated when the heating unit 20 is controlled based on the temperature detected by the temperature detector 70 in a state where the rotational speed of the blower 43 is set to be 0% and the shutter 51 is moved to the closed position.

FIGS. 8A and 8B, 9A and 9B, and 10A and 10B are views illustrating a temperature characteristic and a heater output characteristic of Test Examples 1 to 3, respectively. FIGS. 8A, 9A, and 10A illustrate the time change of the temperature detected by the temperature detector 70, and FIGS. 8B, 9B, and 10B illustrate the time change of the heater output. Further, in FIGS. 8A, 9A, and 10A, time [min] is illustrated on the horizontal axis, and temperature [° C.] is illustrated on the vertical axis, and in FIGS. 8B, 9B, and 10B, time [min] is illustrated on the horizontal axis, and heater output [%] is illustrated on the vertical axis. Further, in the respective drawings, the result in the bottom area (BTM) in the processing container 10 is illustrated by a solid line, the result in the center area (CTR) is illustrated by a broken line, and the result in the top area (TOP) is illustrated by a dotted line. The bottom area is an area below the processing area in which the wafer to be processed is disposed in the processing container 10, and the center area is a central area of the processing area, and the top area is an area above the processing area.

As illustrated in FIG. 8A, in Test Example 1, the temperatures in the bottom area, the center area, and the top area are in a range of 49.9° C. to 50.2° C., and the temperature controllability is high. As illustrated in FIG. 8B, it is considered to be because, in Test Example 1, the heater output is shifted in a range of 2% to 10%, and the control by the heating unit 20 is functioning.

Further, as illustrated in FIG. 9A, in Test Example 2, it can be seen that the temperatures in the bottom area and the top area are within a range of 49.8° C. to 50.2° C. after 60 minutes, but the temperature in the center area is shifted to a temperature higher than 50° C. As illustrated in FIG. 9B, it is considered to be because, in Test Example 2, the time in which the heater output is 0% in the center area is long, and the control by the heating unit 20 is not functioning.

Further, as illustrated in FIG. 10A, in Test Example 3, it can be seen that the temperatures in all of the bottom area, the center area, and the top area are shifted to a temperature higher than 50° C. As illustrated in FIG. 10B, it is considered to be because, in Test Example 3, the time in which the heater output is 0% in the center area is long, and the control by the heating unit 20 is not functioning.

From the above results, it may be considered that the temperature controllability at the low temperature is improved by controlling the temperature by the heating unit 20 in a state where the rotational speed of the blower 43 is set to be 100%, and the cooling medium is supplied from the blowing unit 30 to the processing container 10. Further, it may be considered that the temperature controllability of all of the areas in the height direction of the processing container 10 is improved by controlling the temperature by the heating unit 20 in a state where the shutter 51 is moved to the opened position.

Test Examples 4 and 5

In Test Examples 4 and 5, the temperature controllability during cooling is evaluated by measuring the time change of the temperature detected by the temperature detector 70 and the time change of the heater output, when the processing container 10 in which the temperature is regulated to 750° C. is cooled.

In Test Example 4, in the heat treatment apparatus 1 described above, the time change of the temperature and the heater output is evaluated when the heating unit 20 is controlled based on the temperature detected by the temperature detector 70 in a state where the rotational speed of the blower 43 is set to be 100% and the shutter 51 is moved to the opened position.

In Test Example 5, in the heat treatment apparatus 1 described above, the time change of the temperature and the heater output is evaluated when the heating unit 20 is not used in a state where the rotational speed of the blower 43 is set to be 100% and the shutter 51 is moved to the opened position.

Figure 11A:
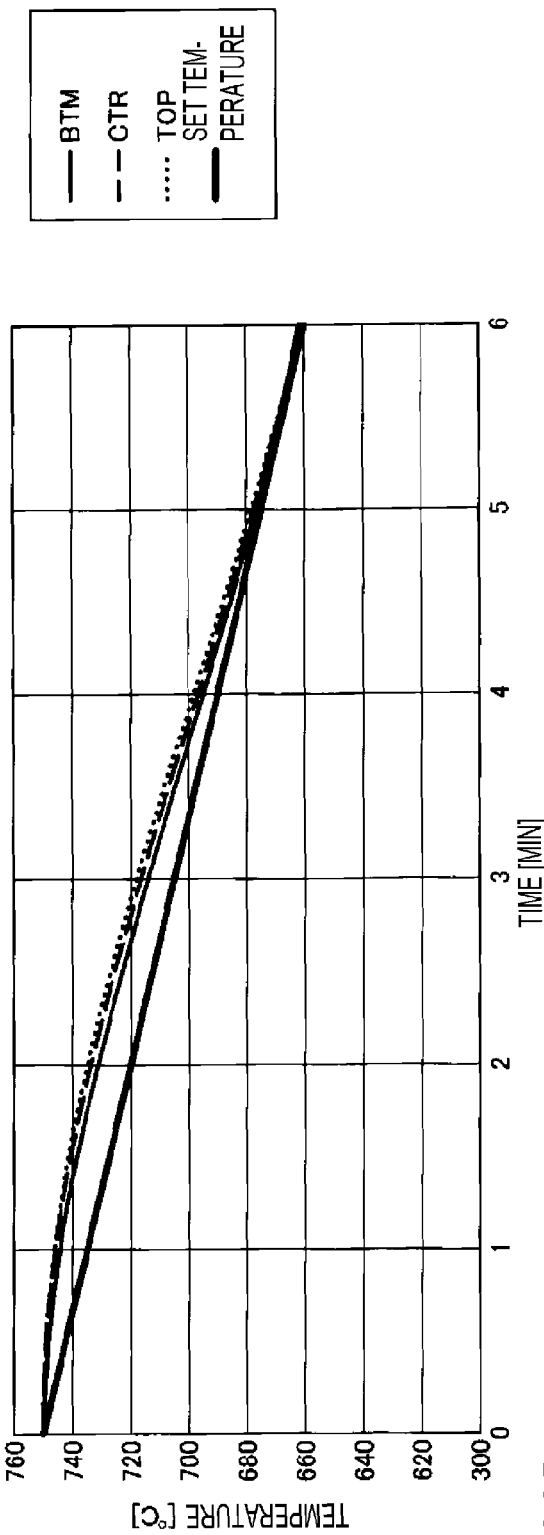
FIGS. 11A and 11B are views illustrating a temperature characteristic and a heater output characteristic of Test Example 4.
Figure 11B:
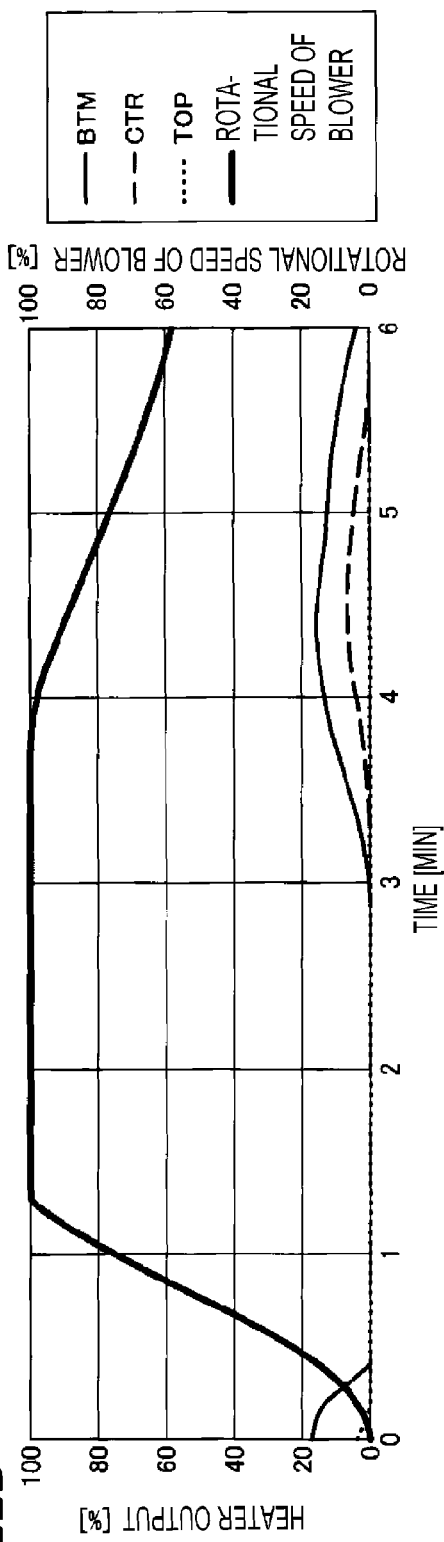
Figure 12A:
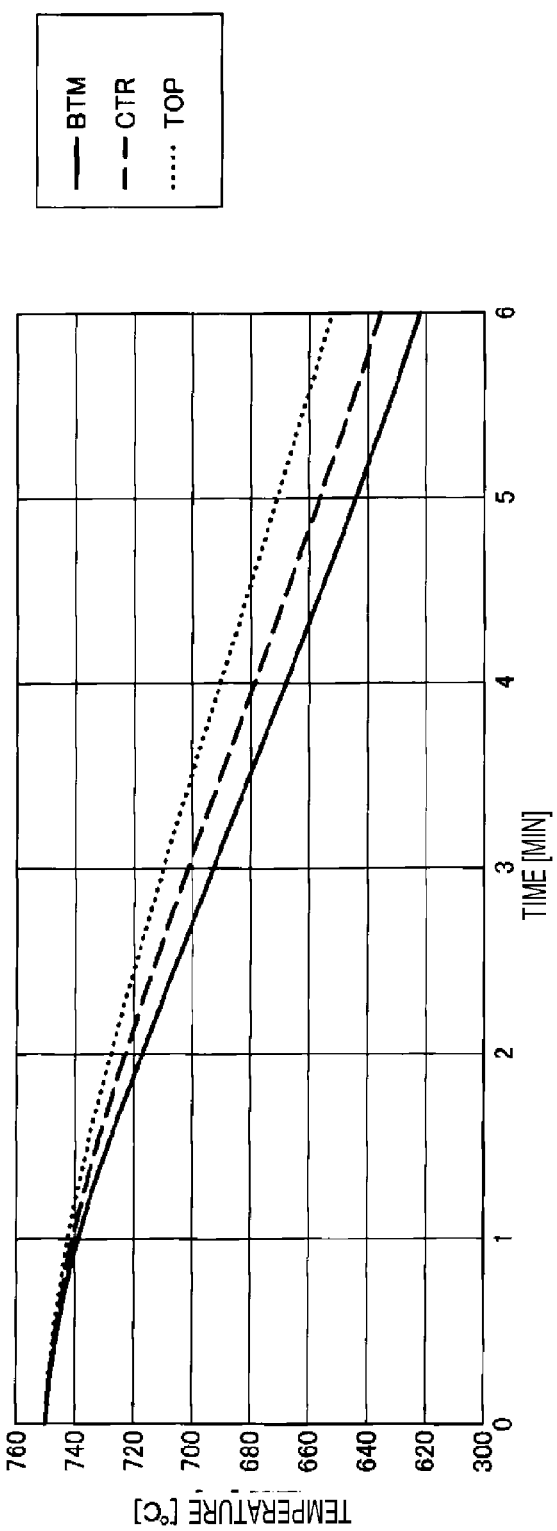
FIGS. 12A and 12B are views illustrating a temperature characteristic and a heater output characteristic of Test Example 5.
Figure 12B:
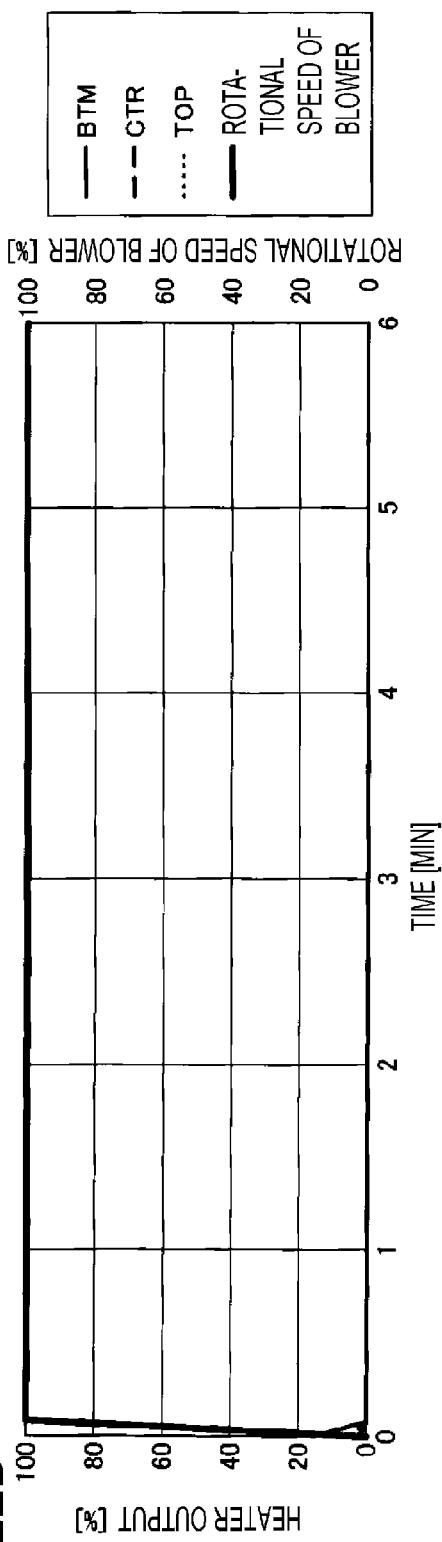

FIGS. 11A and 11B, and 12A and 12B are views illustrating a temperature characteristic and a heater output characteristic of Test Examples 4 and 5, respectively. FIGS. 11A and 12A illustrate the time change of the temperature detected by the temperature detector 70, and FIGS. 11B and 12B illustrate the time change of the heater output. Further, in FIGS. 11A and 12A, time [min] is illustrated on the horizontal axis, and temperature [° C.] is illustrated on the vertical axis, and in FIGS. 11B and 12B, time [min] is illustrated on the horizontal axis, heater output [%] is illustrated on the left vertical axis (first axis), and the rotational speed of the blower 43 is illustrated on the right vertical axis (second axis). Further, in the respective drawings, the result in the bottom area (BTM) in the processing container 10 is illustrated by a solid line, the result in the center area (CTR) is illustrated by a broken line, and the result in the top area (TOP) is illustrated by a dotted line. Further, in FIG. 11A, the set temperature is illustrated by a solid line, and in FIGS. 11B and 12B, the rotational speed of the blower 43 is illustrated by a bold line.

As illustrated in FIG. 11A, in Test Example 4, the cooling speed of all of the bottom area, the center area, and the top area is substantially equal. As illustrated in FIG. 11B, it is considered to be because, even in a case where there is a difference in the cooling performance by the cooling medium in the bottom area, the center area, and the top area, the heater output of the heating unit 20 may be regulated for each area.

In this regard, as illustrated in FIG. 12A, in Test Example 5, the cooling speed of all of the bottom area, the center area, and the top area is different. As illustrated in FIG. 12B, it is considered to be because there is a difference in the cooling performance by the cooling medium in the bottom area, the center area, and the top area.

From the above results, it can be seen that the deviation in the cooling speed in the height direction of the processing container 10 during cooling may be reduced by controlling the heating unit 20 based on the temperature detected by the temperature detector 70 in a state where the rotational speed of the blower 43 is set to be 100%, and the shutter 51 is moved to the opened position. As a result, it is possible to reduce the inter-surface deviation of the temperature history when the wafer which is subjected to the heat treatment at a high temperature is cooled.

According to the present disclosure, the temperature controllability from a low temperature to a high temperature is improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A heat treatment apparatus comprising:
   a processing container configured to accommodate a substrate;
   a heater provided around the processing container;
   a plurality of blowing paths configured to blow a cooling medium into a space between the processing container and the heater; and a shutter configured to simultaneously open/close at least two of the plurality of blowing units and including a slit formed corresponding to each of the blowing units.

2. The heat treatment apparatus according to claim 1, further comprising:
a medium flowing path configured to supply the cooling medium to the plurality of blowing units,
wherein the shutter is provided in the medium flowing path.

3. The heat treatment apparatus according to claim 2, wherein each of the blowing paths includes:
a branch that communicates with the medium flowing path; and
a blowing hole that penetrates the heater and has one end communicating with the branch and the other end communicating with the space, and
wherein the branch is provided with a butterfly valve.

4. The heat treatment apparatus according to claim 3, further comprising:
a blower provided in the medium flowing path and configured to send the cooling medium to the plurality of blowing paths.

5. The heat treatment apparatus according to claim 4, further comprising:
a heat exhaust having one end communicating with the space above the plurality of the blowing paths and the other end communicating with the medium flowing path and configured to discharge the cooling medium in the space; and
a heat exchanger provided in the medium flowing path and configured to cool the cooling medium discharged by the heat exhaust.

6. The heat treatment apparatus according to claim 5, further comprising:
a driver configured to move the shutter between a closed position covering the plurality of blowing paths and an opened position spaced apart from the plurality of blowing paths.

7. The heat treatment apparatus according to claim 6, further comprising:
a temperature detector configured to detect a temperature in the processing container or the space; and
a controller configured to switch between a small flow rate mode for controlling the heater based on the temperature in a state where the shutter is moved to the closed position and a large flow rate mode for controlling the heater based on the temperature in a state where the shutter is moved to the opened position.

8. The heat treatment apparatus according to claim 7, wherein the controller switches to the large flow rate mode in at least one of cases of processing a substrate at a low temperature in the processing container and cooling an inside of the processing container at a high speed.

9. The heat treatment apparatus according to claim 8, wherein the processing container is extended in a vertical direction, and the plurality of blowing paths are provided along a longitudinal direction of the processing container.

10. The heat treatment apparatus according to claim 2, further comprising:
a blower provided in the medium flowing path and configured to send the cooling medium to the plurality of blowing paths.

11. The heat treatment apparatus according to claim 2, further comprising:
a heat exhaust having one end communicating with the space above the plurality of the blowing paths and the other end communicating with the medium flowing path and configured to discharge the cooling medium in the space; and
a heat exchanger provided in the medium flowing path and configured to cool the cooling medium discharged by the heat exhaust.

12. The heat treatment apparatus according to claim 1, further comprising:
a driver configured to move the shutter between a closed position covering the plurality of blowing paths and an opened position spaced apart from the plurality of blowing paths.

13. The heat treatment apparatus according to claim 12, comprising:
a temperature detector configured to detect a temperature in the processing container or the space; and
a controller configured to switch between a small flow rate mode for controlling the heater based on the temperature in a state where the shutter is moved to the closed position and a large flow rate mode for controlling the heater based on the temperature in a state where the shutter is moved to the opened position.

14. The heat treatment apparatus according to claim 13, wherein the controller switches to the large flow rate mode in at least one of cases of processing a substrate at a low temperature in the processing container and cooling an inside of the processing container at a high speed.

15. The heat treatment apparatus according to claim 1, wherein the processing container is extended in a vertical direction, and the plurality of blowing paths are provided along a longitudinal direction of the processing container.

16. A heat treatment method of a heat treatment apparatus including: a heater provided around a processing container accommodating a substrate; a plurality of blowing paths configured to blow a cooling medium into a space between the processing container and the heater; and a shutter configured to simultaneously open/close at least two of the plurality of blowing paths and including a slit formed corresponding to each of the blowing units, the heat treatment method comprising:
switching to a small flow rate mode for controlling the heater based on a temperature in the processing container or the space in a state where the shutter is moved to a closed position and a large flow rate mode for controlling the heater based on the temperature in the processing container or the space in a state where the shutter is moved to an opened position, in response to a processing performed in the heat treatment apparatus.

* * * * *